United States Patent
Prabhu et al.

[11] Patent Number: 5,866,240
[45] Date of Patent: Feb. 2, 1999

[54] THICK CERAMIC ON METAL MULTILAYER CIRCUIT BOARD

[75] Inventors: Ashok Narayan Prabhu, East Windsor; Ellen Schwartz Tormey, Princeton Junction, both of N.J.

[73] Assignees: Sarnoff Corporation, Princeton, N.J.; Sharp Corporation, Japan

[21] Appl. No.: 812,172

[22] Filed: Mar. 6, 1997

[51] Int. Cl.$^6$ .............................. B32B 3/00; H05K 1/03; C03C 1/00
[52] U.S. Cl. .................... 428/210; 174/255; 174/256; 501/32; 501/6; 501/9; 428/212
[58] Field of Search .................... 428/210, 212; 174/256, 255; 501/32, 6, 9

[56] References Cited

U.S. PATENT DOCUMENTS

| | | | |
|---|---|---|---|
| 4,749,665 | 6/1988 | Yano et al. | 501/32 |
| 4,755,490 | 7/1988 | DiLazzaro | 501/32 |
| 4,777,092 | 10/1988 | Kawakami et al. | 501/32 |
| 4,889,760 | 12/1989 | Kippenberg et al. | 428/210 |
| 4,897,509 | 1/1990 | Holleran et al. | 428/210 |
| 5,141,798 | 8/1992 | Chaumonot et al. | 428/210 |
| 5,145,540 | 9/1992 | Foley et al. | 428/210 |
| 5,148,005 | 9/1992 | Fang et al. | 219/505 |
| 5,166,658 | 11/1992 | Fang et al. | 338/23 |
| 5,206,190 | 4/1993 | Jean et al. | 501/32 |
| 5,242,867 | 9/1993 | Lin et al. | 501/32 |
| 5,256,469 | 10/1993 | Cherukuri et al. | 428/210 |
| 5,407,871 | 4/1995 | Mizutani et al. | 501/32 |
| 5,581,876 | 12/1996 | Prabhu et al. | 29/851 |
| 5,657,199 | 8/1997 | Devoe et al. | 361/328 |
| 5,708,570 | 1/1998 | Polinski, Sr. | 361/762 |

*Primary Examiner*—Bruce H. Hess
*Assistant Examiner*—Cathy F. Lam
*Attorney, Agent, or Firm*—William J. Burke

[57] ABSTRACT

Multilayer green tape stacks having sufficient layers so that the fired stack is at least 2 millimeters in thickness on a metal support substrate are made by interleaving two types of green tapes comprising a low dielectric loss glass of a first type including at least 5% of an oxide filler and a green tape of a second type comprising a low dielectric loss glass and a higher amount of an oxide filler than the green tape of the first type, on a metal support substrate. These fired green tape stacks shrink on firing only in the thickness dimension.

14 Claims, 1 Drawing Sheet

THICK CERAMIC ON METAL MULTILAYER CIRCUIT BOARD

This invention relates to multilayer ceramic printed circuit boards that have low shrinkage in two dimensions on firing. More particularly, this invention relates to metal supported multilayer ceramic circuit boards that can incorporate RF components.

BACKGROUND OF THE INVENTION

Ceramic compositions of crystallizing glasses are known which, when mixed with non-crystallizing glasses, form green tape compositions which can be adhered to metal core support substrates such as KOVAR® a trademark of Carpenter Technolory.

KOVAR® is a Fe/Co/Ni alloy. Such alloys include an alloy containing 53.8 weight percent of iron, 29 weight percent of nickel, 17 weight percent of cobalt and 0.2 weight percent of manganese. These alloys display a sharp change in their coefficient of expansion at certain temperatures. Metal KOVAR® plates are available that are plated with a 0.025 mm (1 mil) coating of copper and a 0.025 mm (1 mil) coating of nickel on each side of the KOVAR® core, to a total thickness of 0.025 inch. These plates have a thermal coefficient of expansion (TCE) of 5.8 ppm/°C. (RT to 300° C.) and a thermal conductivity (z or thickness direction) of 21.8 Watt/m°K. This TCE is closely matched to gallium arsenide in the RT to 300° C. range.

As employed for multilayer support substrates, the copper and nickel plated substrates are heat treated in air to oxidize the nickel coating, and then glazed with a $CaO-Al_2O_3-ZnO-B_2O_3$ bonding glass. Such bonding glasses are known and are made by mixing a suitable glass powder with an organic binder and a solvent to form a screen printable ink which is applied to the support. Preferably the bonding glass is applied in two applications to a thickness of 40–70 microns. The glass is dried and densified by firing at 700°–800° C. To improve the adhesion of the bonding glass to KOVAR® supports, about 6% by weight of copper powder can be added to the bonding glass. These prepared KOVAR® support plates are used herein and when co-laminated to low firing temperature green tape compositions, they prevent shrinkage of the ceramic layers in the x and y dimensions.

To form the green tape compositions, crystallizing glasses made from glass systems of the $ZnO-MgO-B_2O_3-SiO_2$ type, are mixed together with non-crystallizing glasses and minor amounts of oxide fillers. For example, crystallizing glasses containing 20–55% by weight of ZnO; 20–28% by weight of MgO; 10–35% by weight of $B_2O_3$; and 10–40% by weight of $SiO_2$, have a thermal coefficient of expansion (TCE) matched to kovar and low dielectric loss properties that are compatible with microwave components; however, they have a low crystallization temperature which inhibits densification of the glass on firing.

These glasses advantageously can be mixed with a lead-based, non-crystallizing glass. Suitably these non-crystallizing glasses contain from 30–80% by weight of PbO, 15–50% by weight of $SiO_2$, up to 10% by weight of $Al_2O_3$, up to 15% by weight of $B_2O_3$ and up to 10% by weight of ZnO.

However, when the crystallizing glasses are mixed with lead-based, non-crystallizing glasses, the TCE is lowered and the dielectric loss properties are increased. The lateral shrinkage (x and y) of the mixed glasses is still high during firing of the glass mixtures as well. The addition of minor amounts of oxide fillers, such as quartz, alumina, forsterite and the like, reduces the lateral shrinkage during firing. Thus these modified ceramics have the desired dielectric properties, low shrinkage during firing, and a TCE matched to KOVAR®.

Table I below sets forth the desired properties for the fired glass-ceramic compositions useful herein:

TABLE I

| | |
|---|---|
| TCE (25–300° C.) | 5–7 ppm/°C. |
| Dielectric Constant @ 1GHz | 5–10 ± 3% |
| Dielectric Loss @ 1 GHz (tan δ) | ≦0.002 |
| Volume Resistivity | $\geq 10^{13}$ ohm-cm |
| Surface Resistivity | $>10^{12}$ ohm-cm |
| Chemical Durability | Resistant to acids, alkalis and plating solutions |
| Buried Conductor Resistance | <4mΩ/square |
| Via conductor Resistance | <1mΩ/via |

The glasses are formed into green tapes in known manner, i.e., by slurrying the glass powders with a resin binder and suitable dispersants and solvent. These slurries are cast to form green tapes. Conductive inks can be screen printed onto the green tapes to form circuit patterns. Several green tapes can be aligned and stacked and laminated under pressure. Via holes punched in the green tapes and filled with conductor inks provide a conductive path between the circuit patterns. These laminated green tape stacks are then aligned with a support substrate coated with a bonding glass, and co-laminated, also under pressure. Since shrinkage occurs mainly in the thickness (z) dimension during firing, to remove the organics and densify the glasses, the circuitry is not disturbed during firing and close tolerances can be maintained.

Further, these ceramics are compatible with low melt temperature conductive inks, such as silver-based inks, used to form the electrically connected circuits on the various layers and to form bond pads and the like. Thus the ceramic circuit boards as described have low dielectric loss properties and are useful for use with microwave/digital packaging.

However, when multilayer green tape stacks that are over about 2 mm in thickness after firing are made, the shrinkage can no longer be closely controlled, and in addition the multilayer stack tends to de-laminate from the metal support when fired. Thick multilayer circuits boards are required when RF components, such as filters, are to be embedded in the ceramic layers. Thus it would be highly desirable to be able to form multilayer printed circuit green tape layers on a metal support which, when fired, are over about 2 mm in thickness and that retain the low dielectric loss properties and low shrinkage in the x and y dimensions of the above-described supported multilayer ceramic circuits.

SUMMARY OF THE INVENTION

We have found that by interleaving green tape layers made from the prior art low dielectric loss glasses mixed with minor amounts of oxide fillers together with green tape layers made from the same glasses but including greater amounts of oxide fillers, many more layers of green tapes can be stacked, laminated and fired with no shrinkage in the x, y directions and no de-lamination from the metal support. These thick multilayer metal supported circuit board stacks are particularly useful when RF components are to be embedded in the stacks.

DETAILED DESCRIPTION OF THE INVENTION

Figure 1:
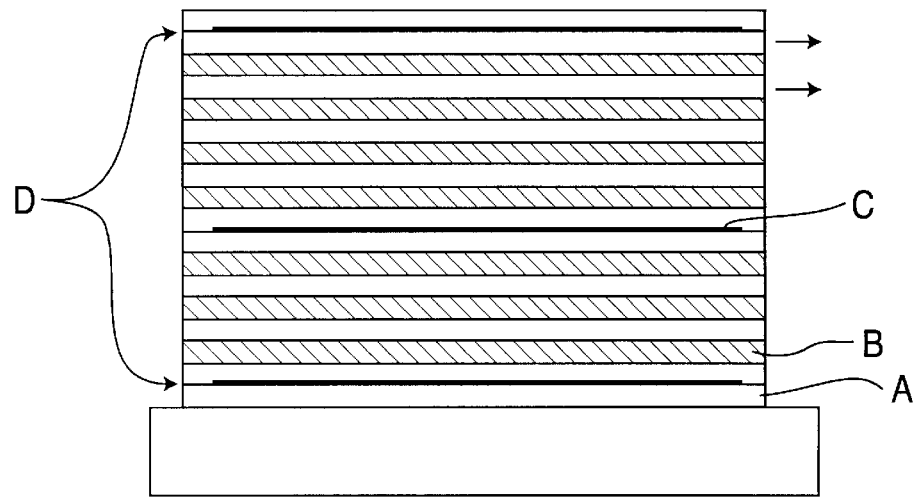
FIG. 1 is a cross sectional view of a multilayer ceramic circuit board of the invention having buried silver layers.

Useful prior art glasses used to make one type of green tape are made from zinc-magnesium-borosilicate crystallizing glasses as described above. A suitable crystallizing glass contains 29.4% by weight of ZnO; 24.5% by weight of MgO; 19.6% by weight of $B_2O_3$; 24.5% by weight of $SiO_2$ and 2.0% by weight of $Co_3O_4$ coloring agent.

This glass is mixed with 9.6% by weight of a non-crystallizing lead-based glass of the lead-zinc-aluminum silicate system. An exemplary glass contains 42.0% by weight of PbO; 10.0% by weight of $Al_2O_3$, 38.8% by weight of $SiO_2$ and 10.0% by weight of ZnO.

These crystallizing-non-crystallizing glass mixtures are combined with oxide fillers, such as alumina, cordierite, quartz, cristobalite, forsterite and willemite, which serve to control the shrinkage and to further modify the TCE. With the addition of a second oxide filler, the desired dielectric properties, shrinkage characteristics and TCE matched to KOVAR® can all be achieved. For example minor amounts of filler oxides, e.g., 1.5–2% by weight of cordierite and 9.5–10.0% by weight of forsterite, produce excellent ceramics for the present applications.

Thus these glasses have major amounts of glass and minor amounts of oxide fillers (<15%). These glasses have excellent dielectric properties at microwave frequencies, such as 1 GHz. These ceramics are referred to hereinafter as Type I glass-ceramics.

A second type of glass-ceramic is made from the same zinc-magnesium-borosilicate glasses but they include increased amounts, over about 25% by weight, of oxide fillers. These glasses have lower shrinkage than the Type 1 glass-ceramics, and are referred to hereinafter as Type 2 glass-ceramics.

The following Table II sets forth examples of different ceramic compositions useful to make the second type of green tape layers.

TABLE II

| Ceramic Composition | 1 | 2 | 3 | 4 |
| --- | --- | --- | --- | --- |
| Crystallizing glass | 50.0 | 50.0 | 57.94 | 66.85 |
| Non-crystallizing glass | 6.1 | 6.1 | 7.04 | 8.15 |
| Forsterite | 30.0 | 21.95 | 30.44 | 21.70 |
| Cordierite | 13.9 | 21.95 | 4.57 | 3.30 |
| Vol. % Glass | 50.9 | 49.1 | 61.9 | 72.4 |
| Vol. % Filler | 49.1 | 50.9 | 38.1 | 27.6 |

Thus these ceramics include major amounts of filler, e.g., about 25–50% by weight.

Green tapes are made by formulating the Type 1 and Type 2 glass-ceramics with a resin binder together with plasticizer, dispersants and solvents in known manner, to form a thick slurry. A typical glass-ceramic composition for use herein has a crystallizing glass particle size of about 10–12.5 microns, a non-crystallizing glass particle size of about 6.5–8 microns, forsterite having a particle size of about 3–5 microns, and cordierite having a particle size of about 2–3 microns. Table III below sets forth a suitable ceramic green tape formulation in percent by weight.

TABLE III

| Composition | Function | Type 1 Glass-Ceramic Green Green Tape | Type II Glass-Ceramic Green Tape |
| --- | --- | --- | --- |
| Primary Glass | | 57.34 | 31.2–36.4 |
| Secondary Glass | | 6.98 | 3.8–4.4 |
| Forsterite powder | Filler | 7.27 | 13.7–16.0 |
| Cordierite powder | Filler | 1.09 | 13.7–16.0 |
| Hypermer ® PS2* | Dispersant | 0.58 | 0.56–0.79 |
| Butvar ® B98** | Binder | 2.04 | 2.13–2.87 |
| Santicizer ® 160*** | Plasticizer | 1.36 | 1.42–1.91 |
| Methyl ethyl ketone | Solvent | 11.67 | 11.58–16.06 |
| Anhydrous ethanol | Solvent | 11.67 | 11.58–16.06 |

*Trademark of ICI Americas, Inc.
**Trademark of Monsanto Co.
***Trademark of Monsanto Co.

The resultant slurry is cast to form a green tape about 0.15–0.20 mm thick, and the green tape is dried.

The two types of green tape using minor and major amounts of amounts of oxide fillers respectively, are then interleaved. Silver or other metal patterns are screen printed on the green tapes to form circuit patterns. Preferably circuit patterns are printed between two green tapes of Type 1, to form a hermetic ceramic, since the Type 2 (high filler content) glass-ceramics tend to become more porous on firing than the Type 1 glass-ceramics.

In order to provide various conductor patterns on the green tapes, a co-firable conductive metal-based thick film conductor ink based on the glass compositions of the invention can be made with a conductive metal powder, such as silver powder, mixed with a small amount of the glasses disclosed above, together with known dispersants, resins and solvents to form a screen printable conductor ink. Top conductor inks can be made in like fashion using silver-palladium powder, or a gold powder. Via fill inks to connect circuit patterns on various green tape layers together can also be made with silver powder, in known manner.

The green tape stack is then suitably laminated at a pressure of about 1.174 $kg/mm^2$ at about 93° C. for four minutes, and co-laminated with the prepared metal support substrate at a pressure of about 1.3–1.4$kg/mm^2$. After laminating and co-laminating, the multilayer stack on the KOVAR® support is fired in a belt furnace at a belt speed of 0.4 inch/min to a peak temperature of 850°–900° C. During firing the organic materials are vaporized, and the low melting glazing glass softens, adhering the multilayer ceramic stack to the metal core. The metal core aids in limiting the shrinkage of the overlying green tapes in the x and y directions. Thus almost all of the shrinkage occurs in the z direction, perpendicular to the metal support. The presence of the interleaved Type 2 glass-ceramics, which have low shrinkage, also serves to constrain the shrinkage of the multilayer stack in the x and y directions.

After firing, a conductive ink may be applied to the top of the fired multilayer stack, as to form bond pads, inductors, microstrip interconnects and the like, in known manner.

The invention will be further described in the following Examples, but the invention is not meant to be limited to the details described therein. In the Examples, percent is by weight.

EXAMPLE 1

Eleven layers of Type 1 green tape (A), three of which had a silver-based ink applied thereto (C,D), and 7 layers of Type 2 green tape (B) were interleaved as shown in FIG. 1. The green tape stack was then laminated and placed over a KOVAR® support substrate, and co-laminated. The stack was fired.

The shrinkage was 17.0% in the z direction, but only 0.96% in the x direction and 0.61% in the y direction. The total stack after firing was 2.50 mm thick.

EXAMPLE 2

Eleven layers of Type I green tape, having metallized planes on three of the layers, were interleaved with Type 2 green tapes, as shown in FIG. 1. FIG. 1 illustrates the Type 1 green tapes as A, Type 2 green tapes as B, C designates embedded RF filters, and D illustrates silver patterning. The green tapes were interleaved and stacked, laminated, co-laminated to a KOVAR® support and fired. The fired stack was 2.40 mm thick.

The shrinkage was 17.0% in the z direction, 0.64% in the x direction and 0.60% in the y direction.

EXAMPLE 3

Eleven layers of Type 1 green tape and 7 layers of Type 2 green tape were interleaved and stacked, laminated and fired. The resultant stack was 2.20 mm thick.

The shrinkage was about 17% in the z direction, 0.83% in the x direction and 0.98% in the y direction.

EXAMPLE 4

Figure 2:
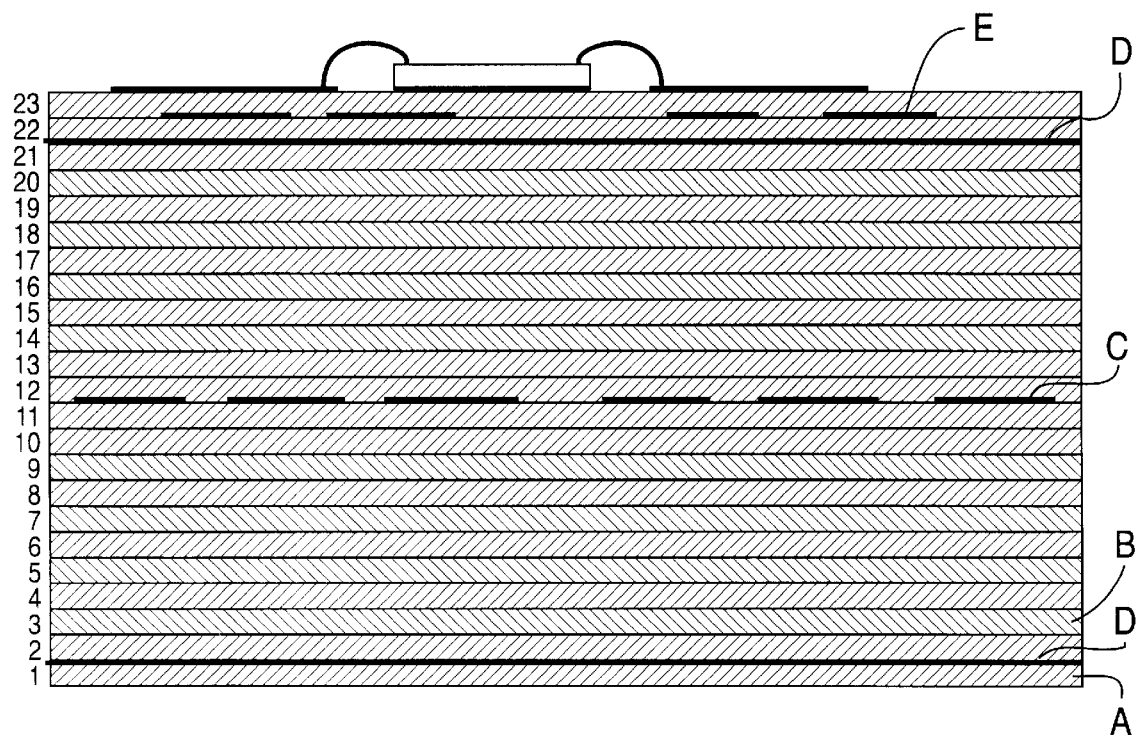
FIG. 2 is a cross sectional view of a multilayer ceramic circuit board of the invention having RF filters embedded in the layers.

Fifteen layers of Type 1 (A) green tape having embedded filters (C) on one layer and ground planes (D) on two layers, as shown i FIG. 2, and 8 layers of Type 2 green tape (B) were interleaved and stacked, laminated and fired to form a stack 2.52 mm in thickness.

The shrinkage was about 17% in the z direction, 0.35% in the x direction and 0.85% in the y direction.

The physical properties of the resultant multilayer ceramic were compared with a stack including Type I green tapes alone. The results are given below in Table IV.

TABLE IV

| Property | Type I tape alone* | Interleaved with Type 2 tape ** |
|---|---|---|
| TCE (25–300° C.) | 6.3 ppm/°C. * | |
| | 7.7 ppm/°C. ** | |
| Dielectric Constant | 6.8 @ 1GHz | 5.4 @ 12GHz |
| Dielectric Loss (tanδ) | 0.001 @ 1GHz | 0.0018 @ 12GHz |
| Volume Resistivity (Π-cm) | $1.5 \times 10^{14}$ | |
| Surface Resistivity (Π-cm) | $>1.0 \times 10^{12}$ | |
| Chemical Durability | pass | |
| Buried Conductor Resistance | 3.6mΩ/square | |
| Via conductor Resistance | 0.72 mΩ/via | |

\* on kovar
\*\* ceramic alone

EXAMPLE 5

Properties of various Type I and Type 2 green tape stacks were fired at 865° C. and their properties measured. The results are summarized below in Table V.

TABLE V

| Sample Stack | Fired Density | ε | Tanδ | Frequency |
|---|---|---|---|---|
| 5 layers Type 1 | 3.14 g/cc | 6.41 | 0.0023 | 15.6 GHz |
| 5 layers Type 2 | 2.01 g/cc | 3.64 | 0.0017 | 17.9 GHz |

TABLE V-continued

| Sample Stack | Fired Density | ε | Tanδ | Frequency |
|---|---|---|---|---|
| 23 layers, of Example 4 | | 5.39 | 0.0018 | 11.6 GHz |
| 20 interleaved layers | | 5.24 | 0.0019 | 12.2 GHz |

Thus the interleaved green tape layers can be stacked to produce thick fired metal supported multilayer circuit boards that shrink in only one dimension.

Although the invention has been described in terms of specific embodiments, it will be clear to those skilled in the art that variations in the glass compositions, the amounts of oxide fillers, the metal support, the number of green tape layers, the types of conductors and conductor inks and the like can be made and are meant to be included herein. The invention is only to be limited by the appended claims.

We claim:

1. A green tape stack comprising alternating layers of green tape of a first type comprising a mixture of crystallizing and non-crystallizing glasses together with 5 to 15% by weight of an oxide filler, with green tape layers of a second type containing a greater amount of oxide filler than the first type, said second type comprising a mixture of crystallizing and non-crystallizing glasses together with at least 25% by weight of an oxide filler onto a metal support surface.

2. A green tape stack according to claim 1 wherein said crystallizing glass includes 20–55% by weight of ZnO, from 10–30% by weight of MgO, from 10–35% by weight of $B_2O_3$ and 10–40% by weight of $SiO_2$.

3. A green tape stack according to claim 1 wherein said non-crystallizing glass includes PbO, $Al_2O_3$ and $SiO_2$.

4. A green tape stack according to claim 3 wherein said glass contains from 30–80% by weight of PbO, from 15–50% by weight of $SiO_2$, up to 10% by weight of $Al_2O_3$, up to 15% by weight of $B_2O_3$ and up to 10% by weight of ZnO.

5. A green tape stack according to claim 1 wherein said oxide filler is selected from the group consisting of alumina, cordierite, quartz, cristobalite, forsterite and willemite.

6. A green tape stack according to claim 1 wherein said metal support substrate is a copper clad Fe/Co/Ni alloy support.

7. A green tape stack according to claim 1 wherein a conductive layer is screen printed between one or more green tape layers of the first type.

8. A green tape stack according to claim 7 wherein said conductive layer is a silver-based layer.

9. A green tape stack according to claim 7 wherein a conductive layer is screen printed onto the top surface of the stack.

10. A fired green tape according to claim 1.

11. A fired green tape according to claim 6.

12. A fired green tape according to claim 7.

13. A fired green tape according to claim 8.

14. A fired green tape according to claim 1 wherein an RF component is embedded in the green tape stack.

\* \* \* \* \*